United States Patent
Eguchi et al.

(10) Patent No.: US 12,023,897 B2
(45) Date of Patent: Jul. 2, 2024

(54) TRANSPARENT DISPLAY DEVICE AND VEHICLE

(71) Applicant: AGC Inc., Tokyo (JP)

(72) Inventors: Ryo Eguchi, Tokyo (JP); Masahide Koga, Tokyo (JP); Yoko Mitsui, Tokyo (JP); Yukihiro Tao, Tokyo (JP)

(73) Assignee: AGC INC., Tokyo (JP)

( * ) Notice: Subject to any disclaimer, the term of this patent is extended or adjusted under 35 U.S.C. 154(b) by 572 days.

(21) Appl. No.: 17/358,339

(22) Filed: Jun. 25, 2021

(65) Prior Publication Data

US 2021/0316535 A1    Oct. 14, 2021

Related U.S. Application Data

(63) Continuation of application No. PCT/JP2019/049977, filed on Dec. 20, 2019.

(30) Foreign Application Priority Data

Dec. 28, 2018    (JP) .................................. 2018-248391

(51) Int. Cl.
*B32B 17/10*    (2006.01)
*G09F 9/33*    (2006.01)
(Continued)

(52) U.S. Cl.
CPC .......... *B32B 17/10495* (2013.01); *G09F 9/33* (2013.01); *B32B 2457/20* (2013.01); *B32B 2605/006* (2013.01)

(58) Field of Classification Search
CPC ........ B32B 17/10036; B32B 17/10495; B32B 17/10541; B32B 17/10761;
(Continued)

(56) References Cited

U.S. PATENT DOCUMENTS

2009/0114928 A1    5/2009    Messere et al.
2009/0257181 A1    10/2009    Ha et al.
(Continued)

FOREIGN PATENT DOCUMENTS

CN    106373983 A    2/2017
CN    106459443 A    2/2017
(Continued)

OTHER PUBLICATIONS

International Searching Authority, "International Search Report," issued in connection with International Patent Application No. PCT/JP2019/049977, dated Feb. 10, 2020.
(Continued)

*Primary Examiner* — Omar F Mojaddedi
(74) *Attorney, Agent, or Firm* — Foley & Lardner LLP

(57) ABSTRACT

A transparent display device includes a transparent substrate, a film provided on the transparent substrate via an adhesive layer, and a plurality of light-emitting units provided on the film, wherein each of the light-emitting units includes a light-emitting diode having a surface area of 1 mm² or less, a thickness of the film is 2 μm or more and 400 μm or less, a value obtained by multiplying a tensile strength of the film by the thickness is $5 \times 10^2$ (Pa·m) or more, and a transmittance of visible light is 20% or more.

15 Claims, 9 Drawing Sheets

(51) Int. Cl.
  *H01L 25/075* (2006.01)
  *H01L 25/16* (2023.01)
  *H01L 33/56* (2010.01)
(58) Field of Classification Search
  CPC .......... B32B 2457/20; B32B 2605/006; H01L 25/0753; H01L 25/167; H01L 33/56; G09F 9/33
  See application file for complete search history.

(56) References Cited

U.S. PATENT DOCUMENTS

| | | | |
|---|---|---|---|
| 2016/0082705 A1 | 3/2016 | Fisher et al. | |
| 2016/0343970 A1* | 11/2016 | Tazaki | B32B 27/302 |
| 2017/0182753 A1 | 6/2017 | Nakashima et al. | |
| 2018/0122786 A1* | 5/2018 | Wu | H01L 25/075 |
| 2018/0299980 A1* | 10/2018 | Fukatani | G06F 3/041 |
| 2019/0304957 A1* | 10/2019 | Yarimizu | H01L 25/0753 |
| 2020/0075663 A1* | 3/2020 | Matsushita | H01L 33/62 |
| 2020/0168590 A1* | 5/2020 | Kim | H01L 23/4985 |
| 2020/0350361 A1 | 11/2020 | Tao et al. | |

FOREIGN PATENT DOCUMENTS

| | | |
|---|---|---|
| JP | 2009-512977 A1 | 3/2009 |
| JP | 2016-522138 A | 7/2016 |
| JP | 2017-157837 A | 9/2017 |
| KR | 10-2008-0062422 A | 7/2008 |
| WO | WO-2014/176059 A1 | 10/2014 |
| WO | WO-2017/061552 A1 | 4/2017 |

OTHER PUBLICATIONS

International Searching Authority, "Written Opinion," issued in connection with International Patent Application No. PCT/JP2019/049977, dated Feb. 10, 2020.

* cited by examiner

TRANSPARENT DISPLAY DEVICE AND VEHICLE

INCORPORATION BY REFERENCE

This application is a continuation of PCT Application No. PCT/JP2019/049977, filed on Dec. 20, 2019, which is based upon and claims the benefit of priority from Japanese Patent Application No. 2018-248391 filed on Dec. 28, 2018. The contents of those applications are incorporated herein by reference in their entireties.

BACKGROUND

The present invention relates to a transparent display device and a vehicle.

Display devices in which a plurality of light-emitting diodes (LED) are provided on a substrate as display pixels are known.

There is a conventional example of a display device in which a plurality of LEDs are provided on a substrate (United States Patent Publication No. 2018/0122786).

In the conventional example in United States Patent Publication No. 2018/0122786, in a process of manufacturing a display device, a substrate is stacked on a wafer substrate in advance, and this substrate is peeled off from the wafer substrate. The substrate peeled off from the wafer substrate and LEDs are incorporated into the display device.

SUMMARY

LED displays, in particular, micro LED displays are required not only to have higher image quality and higher luminance than liquid crystal displays or organic electroluminescence displays but also to have a substrate formed into a film so as to be available for various installation places.

In the case where the substrate is formed into a film, the film is heated in a transparent display device manufacturing process in which a transparent substrate and the film are bonded by an adhesive. Heating the film may generate creases in the film, leading to poor appearance of the transparent display device.

The conventional example in United States Patent Publication No. 2018/0122786 has no description about a problem relating to generation of creases because of heating at the time of manufacture or installation in the substrate on which the LEDs are mounted.

Therefore, the conventional example in United States Patent Publication No. 2018/0122786 cannot fulfill the above-described needs in micro LED displays.

In view of the above, an object of the present invention is to ensure good appearance of a transparent display device.

In order to solve the above problem, the present invention includes a transparent substrate, a film provided on the transparent substrate via an adhesive layer, and a plurality of light-emitting units provided on the film, wherein each of the light-emitting units includes a light-emitting diode having a surface area of 1 mm$^2$ or less, a thickness of the film is 2 μm or more and 400 μm or less, a value obtained by multiplying a tensile strength of the film by the thickness is $5 \times 10^2$ (Pa·m) or more, and a transmittance of visible light is 20% or more.

According to the present invention, the transparent display device has good appearance.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Figure 1:
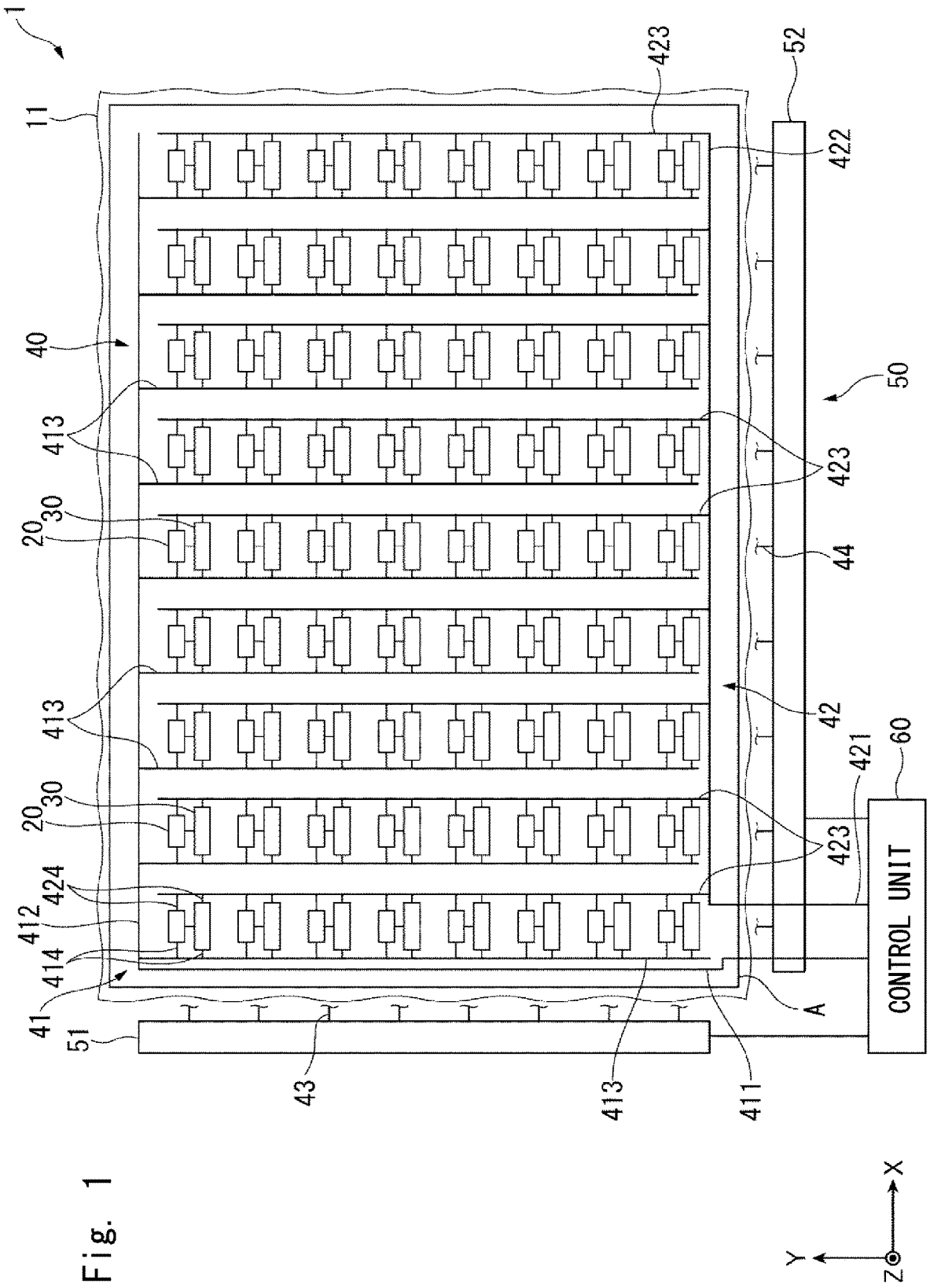
FIG. 1 is a schematic diagram illustrating a basic configuration of a transparent display device according to a related art of the present invention in a plan view.

The following is a description of embodiments for implementing the present invention. In each drawing, the same or corresponding configurations may be designated by the same or corresponding reference numerals, and explanations may be omitted. The present invention is not limited to the following embodiments.

As used herein, the term "transparent display device" means that a display device in which visual information such as a person or a background located on the rear side of the display device (opposite to an observer) is visible under a desired operating environment. "Visible" is determined at least when the display device is non-displayed, that is, not energized.

Also, as used herein, the term "transparent" means that the transmittance of visible light is 20% or more, preferably 60% or more, and more preferably 70% or more. It may also refer to a transmittance of 5% or more and a haze (cloudiness) of 10 or less. If the transmittance is 5% or more, sufficient visibility can be secured because the brightness of the outdoors is the same as or more than that of indoors when looking outdoors from indoors during the daytime. If the transmittance is 20% or more, even if the brightness of the observer side and the other side (rear side) of the transparent display device is the same, the other side of the transparent display device can be seen practically without any problem. If the haze is 10 or less, the contrast of the background can be secured to 10, so that the other side of the transparent display device can be seen practically without any problem. The term "transparent" means transparent, regardless of whether or not a color is applied, that is, it includes colorless transparent and colored transparent.

As used herein, the term "transmittance of visible light" means a percentage of transmission of visible light incident on a display region of a certain surface area including a portion that transmits light of the transparent display device and a portion that does not transmit light, e.g., a portion where an element is disposed. The transmittance of visible light refers to the value (%) measured by a method conforming to ISO 9050. Haze (cloudiness) refers to the value measured by a method conforming to ISO 14782. Measurement of the transmittance of visible light is performed under a condition in which a surface area of a display region of the transparent display device that transmits a bundle of light rays includes at least one pixel or more, and preferably a plurality of pixels.

As used herein, the term "display region" means a region in which an image including characters is displayed in the transparent display device and is a region including a maximum range in which luminance can be changed by the light-emitting units and a range in which the wiring connecting to the light-emitting units and the wiring in proximity to the light-emitting units are arranged.

As used herein, the term "flexible" means having shape conformability and, in the case where the film is provided on the transparent substrate, means the film changing its shape according to the shape of the transparent substrate. For example, in the case where the film is provided on a curved transparent substrate, the above term means the film changing its shape according to the curved shape of the transparent substrate.

Related Art

First, a schematic configuration of the transparent display device of the related art of the present invention will be described.

As illustrated in FIG. 1, a transparent display device 1 has a transparent substrate 11, light-emitting units 20, IC chips 30, a wiring unit 40, a driver 50, and a control unit 60 including an electric circuit board. In this related art and each of the embodiments described below, a display region A of the transparent display device 1 includes the light-emitting units 20 and the IC chips 30 as a whole, and a part of a region of the wiring unit 40, in a plan view. If the driver 50 is made of a transparent material and is adjacent to a region of the transparent substrate 11, where an image is displayed, the driver 50 may also be included in the display region A.

The light-emitting units 20 are arranged in the display region A in a row direction and a column direction, that is, the X-direction and the Y-direction in the drawing, respectively, in a matrix pattern. However, the arrangement form of the light-emitting units 20 is not limited to a matrix pattern but may also be a staggered grid pattern or another arrangement form in which light-emitting units of the same color are arranged in a specific direction at substantially constant intervals.

The IC chips 30 are connected to the light-emitting units 20 and drive the light-emitting units 20. Note that the IC chips 30 may be omitted.

The wiring unit 40 has a power line 41, a ground line 42, row data lines 43, and column data lines 44.

The power line 41 includes a first power main line 411 extending from the control unit 60 in the upward direction, i.e., the column direction, in FIG. 1; a second power main line 412 extending from an end of the first power main line 411 in the rightward direction, i.e., the row direction; a plurality of first power branch lines 413 extending from a plurality of locations on the second power main line 412 in the downward direction, i.e., the column direction; and second power supply branch lines 414 extending in the rightward direction, i.e., the row direction, respectively from a plurality of locations on the first power main line 411 and the first power branch lines 413 and connected to the light-emitting units 20 and the IC chips 30, respectively.

The ground line 42 includes a first ground main line 421 extending from the control unit 60 in the upward direction, i.e., the column direction, in FIG. 1; a second ground main line 422 extending from an end of the first ground main line 421 in the rightward direction, i.e., the row direction; a plurality of first ground branch lines 423 extending from a plurality of locations on the second ground main line 422 in the upward direction, i.e., the column direction; and second ground branch lines 424 extending from a plurality of locations on the first ground branch lines 423 in the leftward direction, i.e., the row direction, and connected to the light-emitting units 20 and the IC chips 30, respectively. The second ground main line 422 is not electrically and directly connected to the first power branch lines 413. The first ground branch lines 423 are not electrically and directly connected to the second power main line 412.

In this configuration, an electric current supplied from the control unit 60 flows to each light-emitting unit 20 and each IC chip 30 via the power line 41 and returns to the control unit 60 via the ground line 42.

The row data lines 43 are electrically connected to a row driver 51 and the IC chips 30 lined up in the row direction. The column data lines 44 are electrically connected to a column driver 52 and the IC chips 30 lined up in the column direction.

The driver 50 controls the driving of the IC chips 30 under the control of the control unit 60. The driver 50 is connected to the IC chips 30 lined up in the column direction.

The driver 50 has the row driver 51 that controls driving of the IC chips 30, and the column driver 52 that is connected to the IC chips 30 lined up in the row direction and controls driving of the IC chips 30.

First Embodiment

Next, the detailed configuration of the transparent display device 1 of the first embodiment will be described with reference to FIG. 2.

Configuration of First Embodiment

Figure 2:
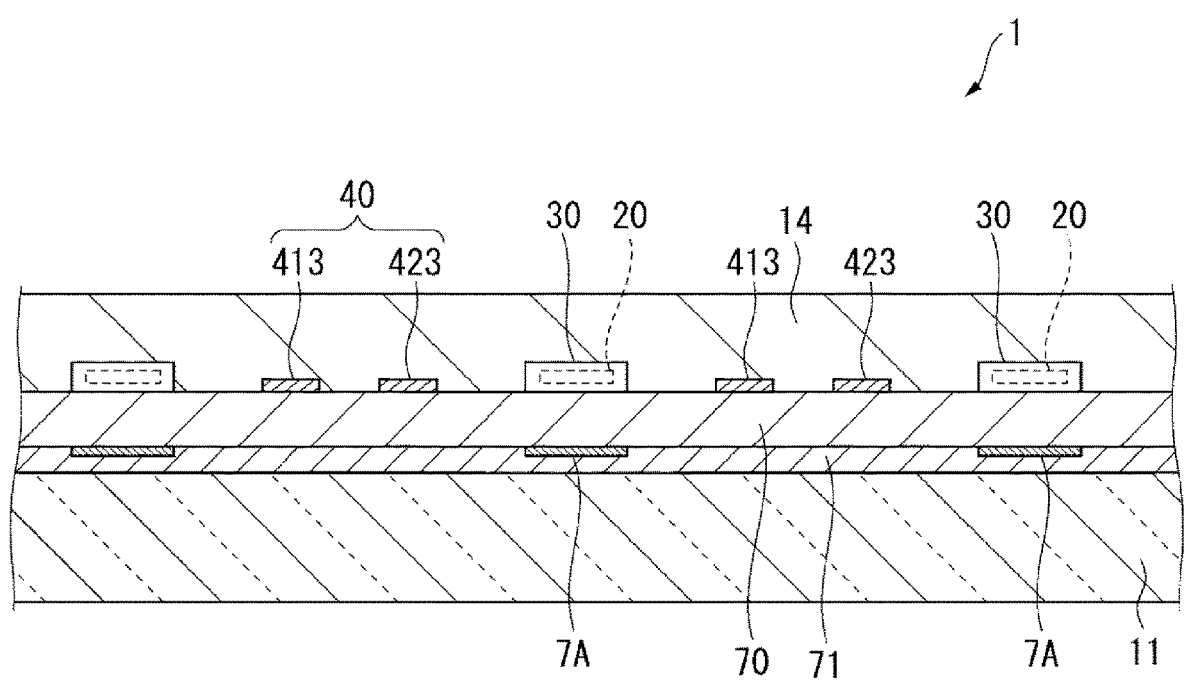
FIG. 2 is a cross-sectional view illustrating a part of the transparent display device according to a first embodiment of the present invention.

As illustrated in FIG. 2, an adhesive layer 71 is provided on the main surface of the transparent substrate 11, and a film 70 is provided on the adhesive layer 71.

The light-emitting units 20, the IC chips 30, the wiring unit 40, and an insulation layer 14 insulating these components are disposed on the film 70. The insulation layer 14 is a protective layer that protects the light-emitting units 20, the IC chips 30, and the wiring unit 40.

Each of the plurality of light-emitting units 20 corresponds to each pixel of the transparent display device 1, and a single light-emitting unit 20 constitutes one pixel.

Each light-emitting unit 20 includes at least one light-emitting diode (LED), and the at least one LED constitutes each pixel of the transparent display device 1.

Each light-emitting unit 20 may include two or more LEDs. For example, each light-emitting unit 20 may include a red LED, a green LED, and a blue LED. Each LED corresponds to each sub-pixel that constitutes one pixel, i.e., a sub-pixel. In this manner, each light-emitting unit 20 has LEDs that emit each of the three primary colors of light (R, G, and B), so that a set of LEDs of the three colors can constitute a single pixel, which can thereby display a full-color image.

The LEDs used in this embodiment are preferably micro-sized, so-called mini-LEDs, and more preferably, those having a size even smaller than mini-LEDs, so-called micro-LEDs. Specifically, the length of the mini-LEDs in the row direction, i.e., the X-direction, may be 1 mm or less, and the length in the column direction, i.e., the Y-direction, may be 1 mm or less. The length of the micro LED in the row direction may be 100 μm or less, and preferably 50 μm or less. The length of the micro LED in the column direction may be 100 μm or less, and preferably 50 μm or less. Although there is no particular limit to the lower limit of the length of the LED in the row direction and column direction, it is preferable from the standpoint of thermal countermeasures to have a size of a certain level or higher because the amount of heat generated rises in inverse proportion to the surface area when the same luminance is obtained in a small surface area. In addition, it is preferable that each of them be 1 μm or more to reduce an edge effect in particular, due to various conditions in manufacturing.

The surface area occupied by one LED on the film 70 may be 1 mm$^2$ or less. This surface area is preferably 10,000 μm$^2$ or less.

Normally, it is said that the limit for a person with visual acuity of 1.5 to be able to see the thickness in an image at a distance of 1 m is 50 μm and it is difficult to see directly when the thickness is 15 μm or less. Therefore, by using a micro-sized LED as described above, the LED is not visible or, even if it is visible, its presence is not noticeable even when an observer observes the display device at a relatively close distance, for example, at a distance of several tens of centimeters to about 2 meters. Therefore, the visibility of the image on the rear side of the display device is improved.

The transparency of the LED itself is low, for example, its transmittance is about 10% or less. The reason for this is that a mirror structure is formed on the top or bottom surface of the LED in order to efficiently extract the electrodes and light to one side. Therefore, by using micro-sized LEDs, the region where the LEDs prevent light transmission can be reduced, and the region with low transmittance, e.g., the region having a transmittance of 20% or less, in the display region can be reduced. In addition, the use of micro-sized LEDs increases the region of high transmittance in pixels, which improves the transparency of the display device and the visibility of the image on the rear side.

There is no limitation on the type of LED, and it can be a chip type. The LED may be unpackaged, entirely enclosed in a package, or at least partially covered with resin. When the LEDs are packaged, the surface area occupied by one LED and the dimensions of the LED described above, i.e., the x-direction and y-direction dimensions, refer to the surface area and dimensions in the state after packaging. When three LEDs are enclosed in a single package, the surface area of each LED can be one third or less of the total package surface area.

The luminous efficacy of the LED, i.e., the energy conversion efficiency, is preferably 1% or more. By using LEDs with a luminous efficacy of 1% or more, sufficient luminance can be obtained even if the size of the LED is minute, as described above, and the LEDs can be used as display members during the day.

The pixel density in the display region of the display device in this embodiment can be 0.8 ppi or more, preferably 5 ppi or more, more preferably 10 ppi or more, and even more preferably 25 ppi or more.

The pixel pitch can be equivalent to the pitch of LED of the same color included in each light-emitting unit 20. For example, a pixel pitch $P_{px}$ in the X-direction can correspond to the pitch of the red LEDs in the X-direction, and a pixel pitch $P_{py}$ in the Y-direction can correspond to the pitch of the red LEDs in the Y-direction.

The surface area of one pixel can be selected appropriately depending on the size of the screen or display region, application, viewing distance, and the like. By setting the surface area of one pixel to be $1 \times 10^4$ μm$^2$ or more and $2.5 \times 10^7$ μm$^2$ or less, the transparency of the display device can be improved while ensuring appropriate display performance.

The surface area of each LED may be 30% or less of the surface area of one pixel. By reducing the surface area of one LED to 30% or less of the surface area of one pixel, transparency and the visibility of the image on the rear side of the display device can be improved.

Each IC chip 30 is arranged corresponding to each pixel and drives each pixel. Each IC chip 30 can also be arranged corresponding to a plurality of pixels, that is, for each plurality of pixels, to drive the plurality of pixels.

Although the IC chips 30 may be arranged on the film 70, a metal pad made of copper, silver, gold, or the like may be disposed on the film 70 and the IC chip may be disposed thereon. The LEDs may also be arranged on the pad in a similar manner.

As the IC chips 30, a hybrid IC or the like including an analog portion and a logic portion can be used. The surface area of the IC chip 30 may be 100,000 μm$^2$ or less. The analog portion of the IC chip 30 may include a transformer circuit or the like in addition to the circuit for controlling the amount of electric current. The transparency of the IC chip 30 itself is low, and for example, has a transmittance of about 20% or less. Therefore, by using the IC chips 30 of the above size, the region where the IC chips 30 interfere with the transmission of light may be reduced, which may contribute to a reduction of the region of low transmittance in the display region. The use of the IC chips 30 having a surface area of 20,000 μm$^2$ or less increases the region of high transmittance, thereby improving the transparency of the display device and the visibility of the image on the rear side.

The wiring unit 40 is connected to each light-emitting unit 20, and each light-emitting unit 20 may be individually controllable.

The materials of the wiring unit 40 include metals such as copper, aluminum, silver, and gold, carbon nanotubes, ITO (tin-doped indium oxide (Indium Tin oxide)), ATO (antimony-doped tin oxide (Antimony Tin oxide)), PTO (phosphorus-doped tin oxide (Phosphorus Tin oxide)), $ZnO_2$, ZSO $((ZnO)_x \cdot (SiO_2)_{(1-x)})$, and other transparent conductive materials. Of these materials, copper is preferred because of its low resistivity.

The wiring unit 40 may be coated with a material such as Ti, Mo, copper oxide, or carbon for the purpose of reducing reflectivity. Unevenness may be formed on the surface of the coated material.

The width of each wire included in the wiring unit 40 is preferably 100 μm or less, and more preferably 15 μm or less. It is said that the limit for a person with visual acuity of 1.5 to be able to see the thickness in an image at a distance of 1 m is 50 μm, and it is difficult to see directly when the thickness is 15 μm or less. Therefore, by setting the width of the line to 100 μm or less, preferably 50 μm or less, the wiring unit is not visible or, even if visible, is not noticeable even when the observer observes the display device at a relatively close distance, for example, at a distance of several tens of centimeters or more and about 2 meters or less. Therefore, the visibility of the image on the rear side of the display device is improved.

The transparent substrate 11 is not particularly limited as long as it has insulating properties and is transparent, and may include a resin. The transparent substrate 11 may be provided with an insulating material, not illustrated, on its surface.

Examples of the resin used for the transparent substrate 11 include polyester resins such as polyethylene terephthalate (PET) and polyethylene naphthalate (PEN); olefin resins such as cycloolefin polymers (COP) and cycloolefin copolymers (COC); cellulose resins such as cellulose, acetyl cellulose, and triacetyl cellulose (TAC); imide resins such as polyimide (PI); vinyl resins such as polyethylene (PE), polyvinyl chloride (PVC), polystyrene (PS), polyvinyl acetate (PVAc), polyvinyl alcohol (PVA), and polyvinyl butyral (PVB); acrylic resins such as polymethyl methacrylate (PMMA) and ethylene vinyl acetate copolymer resin (EVA) or those in which cross-linking has been performed on their backbone; and urethane resins.

As the transparent substrate 11, glass can be used.

Both inorganic glass and organic glass may be used for the glass constituting the transparent substrate 11. An example of the inorganic glass includes soda-lime glass. The inorganic glass may be either unreinforced glass or reinforced glass. Unreinforced glass is made by forming molten glass into a sheet and cooling it slowly.

Reinforced glass is made by forming a compressive stress layer on the surface of the unreinforced glass. The reinforced glass may be either physically reinforced glass, e.g., tempered glass, or chemically reinforced glass. On the other hand, examples of the organic glass include transparent resins such as polycarbonate and acrylic resins.

As the material of the adhesive layer 71, for example, a material containing, as its main component, a polyurethane resin, an acrylic resin, an epoxy resin, a silicone resin, an acrylic resin, a vinyl acetate copolymer (EVA), polyvinyl butyral (PVB), or the like is used. Of these components, polyvinyl butyral (PVB) is preferable.

Examples of the material of the film 70 include polyethylene terephthalate (PET), polyethylene naphthalate (PEN), cycloolefin polymers (COP), polyimide (PI), amorphous polyarylate, polysulfone, polyethersulfone, polyetherimide, fluororesins, and liquid crystalline polymers.

The thickness of the film 70 is 2 μm or more and 400 μm or less. With the thickness of the film 70 being 2 μm or more, the film 70 can be manufactured easily, and with the thickness of the film 70 being 400 μm or less, the rigidity of the film 70 is not too large and thus the film 70 is flexible.

The elastic modulus of the film 70 at 25° C. is, for example, $1.0 \times 10^8$ Pa or more and $1.0 \times 10^{10}$ Pa or less, and preferably $1.0 \times 10^9$ Pa or more and $6.0 \times 10^9$ Pa or less.

The value obtained by multiplying the elastic modulus of the film 70 by the thickness of the film 70 is $1.5 \times 10^5$ (Pa·m) or more, and preferably $2.0 \times 10^5$ (Pa·m) or more.

Here, the elastic modulus of the film 70 is the elastic modulus at 25° C., and its definition is specified in JIS K 7161 and JIS K 7127.

The elastic modulus of the insulation layer 14 is, for example, $1.0 \times 10^6$ Pa or more and $5.0 \times 10^9$ Pa or less, preferably $1.0 \times 10^7$ Pa or more and $1.0 \times 10^9$ Pa or less, and even more preferably $1.0 \times 10^8$ Pa or more and $1.0 \times 10^9$ Pa or less.

The tensile strength of the film 70 at 25° C. is, for example, $1.0 \times 10^7$ Pa or more and $1.0 \times 10^9$ Pa or less, and preferably $3.0 \times 10^7$ Pa or more and $3.0 \times 10^8$ Pa or less.

The value obtained by multiplying the tensile strength of the film 70 by the thickness of the film 70 is $5.0 \times 10^2$ (Pa·m) or more, preferably $1.0 \times 10^3$ (Pa·m) or more, and more preferably $3.0 \times 10^3$ (Pa·m) or more. Here, the tensile strength of the film 70 is the maximum tensile stress obtained by dividing the maximum load withstood until the specimen breaks by the original cross-sectional area of the specimen, and its definition is specified in JIS K 7161 and JIS K 7127.

When the value obtained by multiplying the elastic modulus of the film 70 by the thickness of the film 70 is $1.5 \times 10^5$ (Pa·m) or more and the value obtained by multiplying the tensile strength of the film 70 by the thickness of the film 70 is $5 \times 10^2$ (Pa·m) or more, the rigidity of the film 70 is not too large and thus the film 70 is flexible. Therefore, the film 70 has a shape conforming to the planar shape of the transparent substrate 11.

Effects of First Embodiment

In the transparent display device 1, the thickness of the film 70 is 2 μm or more and 400 μm or less, the value obtained by multiplying the elastic modulus of the film 70 by the thickness of the film 70 is $1.5 \times 10^5$ (Pa·m) or more, and the value obtained by multiplying the tensile strength of the film 70 by the thickness of the film 70 is $5 \times 10^2$ (Pa·m) or more. Therefore, even when the film 70 is heated, generation of creases of the film 70 is suppressed. The film 70 with no creases ensures good appearance of the transparent display device 1.

Modification of First Embodiment

In the first embodiment, the material of the adhesive layer 71 may be a cycloolefin polymer (COP).

The transparent substrate 11 may have a curved shape.

Second Embodiment

The second embodiment of the present invention will be described with reference to FIG. 3.

The layer configuration of the second embodiment is different from that of the first embodiment, but the other configurations thereof are the same as those of the first embodiment.

Configuration of Second Embodiment

Figure 3:
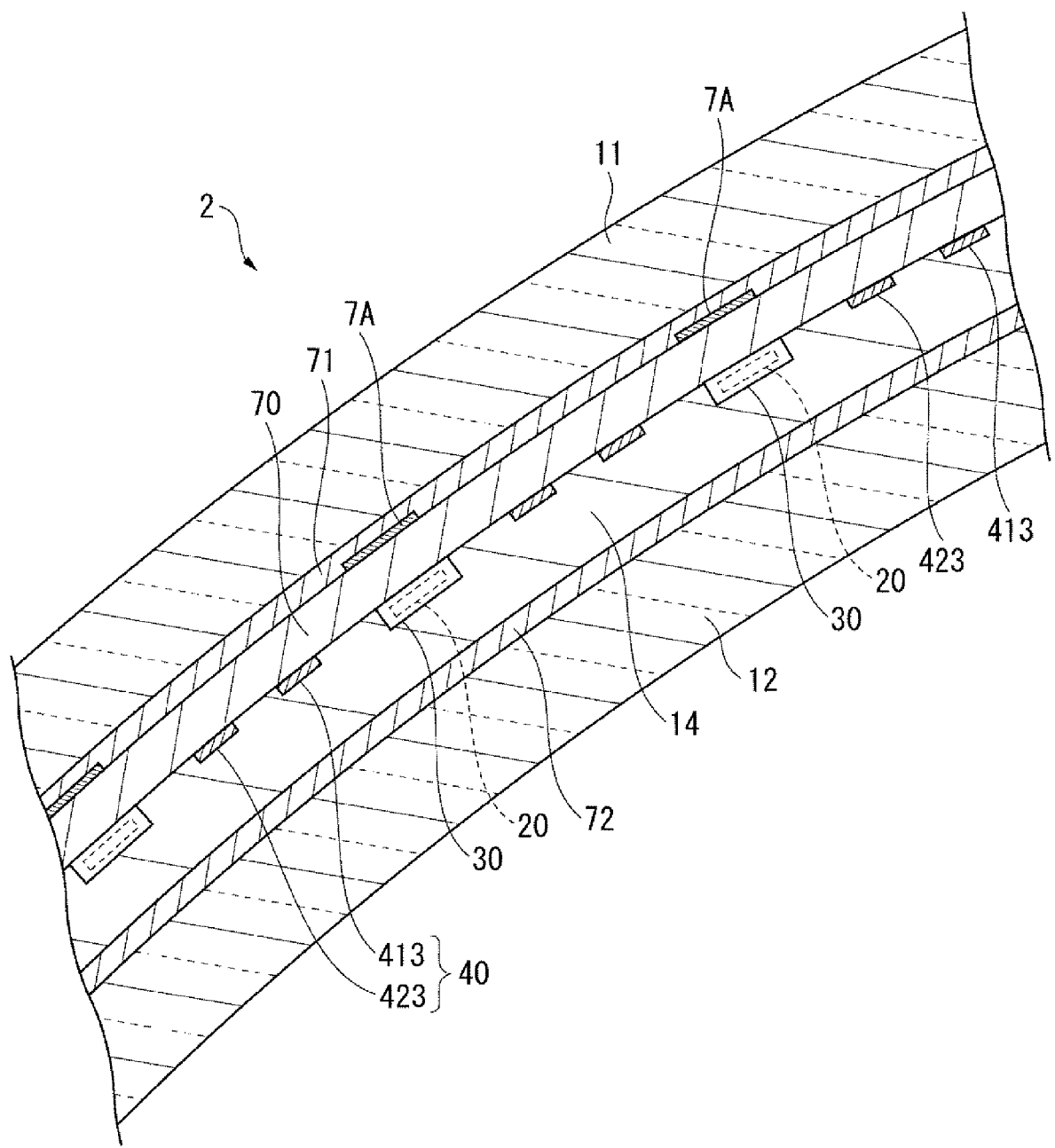
FIG. 3 is a cross-sectional view illustrating a part of the transparent display device according to a second embodiment of the present invention.

As illustrated in FIG. 3, a transparent display device 2 of the second embodiment has a first transparent substrate 11; a first adhesive layer 71; a film 70 having a light shielding layer 7A formed thereon; light-emitting units 20, IC chips 30, a wiring unit 40, and an insulation layer 14 which are provided on the film 70; a second adhesive layer 72; and a second transparent substrate 12. Here, the transparent substrate 11 of the first embodiment corresponds to the first transparent substrate 11 of this embodiment, and the adhesive layer 71 corresponds to the first adhesive layer 71.

The second adhesive layer 72 is formed of the same material as the first adhesive layer 71.

The second transparent substrate 12 is formed of the same material as the first transparent substrate 11. The thicknesses of the second transparent substrate 12 and the first transparent substrate 11 may be the same or may be different.

In the second embodiment, the first transparent substrate 11, the adhesive layer 71, the film 70, the second adhesive layer 72, and the second transparent substrate 12 are curved so as to have a convex upper side and a concave lower side in FIG. 3.

The first transparent substrate 11 is disposed on the upper side in FIG. 3, and the second transparent substrate 12 is disposed on the lower side in FIG. 3.

The film 70 in a state of being incorporated into the transparent display device 2 curves along the shapes of the first transparent substrate 11 and the second transparent substrate 12.

The curved film 70 exerts a tensile force on its surface on the adhesive layer 71 side and exerts a compressive force on its surface on the second adhesive layer 72 side.

The thickness of the film 70 is 2 μm or more and 400 μm or less, and the value obtained by multiplying the elastic modulus of the film 70 by the thickness of the film 70 is $1.5 \times 10^5$ (Pa·m) or more, similar to the first embodiment. This allows the film 70 to change its shape according to the shapes of the first transparent substrate 11 and the second transparent substrate 12 which are curved.

The elastic modulus of the film 70 is larger than the elastic modulus of the first adhesive layer 71, and the elastic modulus of the insulation layer 14 is larger than the elastic modulus of the first adhesive layer 71.

The adhesive layer 71 and the second adhesive layer 72 are formed of the same material and have the same elastic modulus.

As the first adhesive layer 71 between the first transparent substrate 11 and the film 70, an adhesive material having stretchability is preferably used. Similarly, as the second adhesive layer 72 between the film 70 and the second transparent substrate 12, an adhesive material having stretchability is preferably used.

Examples of the adhesive material having stretchability include silicone resins, olefin resins such as cycloolefin polymers (COP), and vinyl resins such as polyvinyl butyral (PVB).

In addition, the first adhesive layer 71 and the second adhesive layer 72 may have a configuration in which an adhesive material having high stretchability is stacked on an adhesive material having low stretchability. Examples of the adhesive material having low stretchability include epoxy resins and acrylic resins, and examples of the adhesive material having high stretchability include silicone resins, olefin resins such as cycloolefin polymers (COP), and vinyl resins such as polyvinyl butyral (PVB).

In the case where the adhesive material having high stretchability is stacked on the adhesive material having low stretchability, the adhesive material having low stretchability is disposed on the compression side, and the adhesive material having high stretchability is disposed on the tension side.

The curvature at which the first transparent substrate 11 and the second transparent substrate 12 are capable of bending is set in relation to the stress at which the light-emitting units 20, the IC chips 30, and the wiring unit 40 are peeled off from the film 70.

The wiring unit 40 preferably has stretchability, since the film 70 curves. To allow the wiring unit 40 to have stretchability, a power line 41, a ground line 42, row data lines 43, and column data lines 44 which constitute the wiring unit 40 are preferably wavelike or zigzag, not straight.

Effects of Second Embodiment

In the transparent display device 2, the first transparent substrate 11, the first adhesive layer 71, the film 70, the second adhesive layer 72, and the second transparent substrate 12 are stacked. The thickness of the film 70 is 2 μm or more and 400 μm or less, the value obtained by multiplying the elastic modulus of the film 70 by the thickness of the film 70 is $1.5 \times 10^5$ (Pa·m) or more, and the value obtained by multiplying the tensile strength of the film 70 by the thickness of the film 70 is $5 \times 10^2$ (Pa·m) or more. Therefore, even when the film 70 is heated and curved, generation of creases and cracks of the film 70 is suppressed.

The film 70 with neither creases nor cracks ensures good appearance of the transparent display device 2.

Modification of Second Embodiment

In the second embodiment, the materials of the first adhesive layer 71 and the second adhesive layer 72 may be different, and the materials of the first transparent substrate 11 and the second transparent substrate 12 may be different.

EXAMPLES

The effects of the first embodiment and the second embodiment will be confirmed.

Cases 1 to 3 are examples and Cases 4 to 8 are comparative examples.

(Case 1)

A cycloolefin polymer (COP) (product name: ZEONOR ZF16) was used for the film 70. The thickness of the film 70 is 100 μm.

The elastic modulus of the film 70 is $2.0 \times 10^9$ Pa, and the tensile strength of the film 70 is $7.5 \times 10^7$ Pa.

The value obtained by multiplying the elastic modulus of the film 70 by the thickness of the film 70 is $2.0 \times 10^5$ Pa·m, and the value obtained by multiplying the tensile strength of the film 70 by the thickness of the film 70 is $7.5 \times 10^3$ Pa·m.

First, the film 70 was sandwiched between the first adhesive layer 71 and the second adhesive layer 72 and then placed in flat plate glasses as the first transparent substrate 11 and the second transparent substrate 12 to prepare a sample. The first adhesive layer 71 and the second adhesive layer 72 were formed of a 30 mil polyvinyl butyral (PVB).

The sample was taken out and then its appearance was visually checked under a fluorescent lamp.

An appearance defect due to undulations of the film 70 is defined as "creases" and an appearance defect due to breaks of the film 70 is defined as "cracks." The cracks also include tears and fractures.

In Case 1, neither "creases" nor "cracks" were observed in the appearance of the film 70.

(Case 2)

Polyethylene terephthalate (PET) was used for the film 70. The thickness of the film 70 is 50 μm.

The elastic modulus of the film 70 is $4.4 \times 10^9$ Pa, and the tensile strength of the film 70 is $2.8 \times 10^8$ Pa.

The value obtained by multiplying the elastic modulus of the film 70 by the thickness of the film 70 is $2.2 \times 10^5$ Pa·m, and the value obtained by multiplying the tensile strength of the film 70 by the thickness of the film 70 is $1.4 \times 10^4$ Pa·m.

Similarly to Case 1, a sample was prepared by using the film 70, and the sample was heat treated in a vacuum bag and then heated and pressure treated by an autoclave. The sample was taken out and then its appearance was visually checked under a fluorescent lamp.

In Case 2, similarly to Case 1, neither "creases" nor "cracks" were observed in the appearance of the film 70.

(Case 3)

Polyethylene naphthalate (PEN) was used for the film 70. The thickness of the film 70 is 50 μm.

The elastic modulus of the film 70 is $5.3 \times 10^9$ Pa, and the tensile strength of the film 70 is $2.0 \times 10^8$ Pa.

The value obtained by multiplying the elastic modulus of the film 70 by the thickness of the film 70 is $2.7 \times 10^5$ Pa·m, and the value obtained by multiplying the tensile strength of the film 70 by the thickness of the film 70 is $1.0 \times 10^4$ Pa·m.

Similarly to Case 1, a sample was prepared by using the film 70, and the sample was heat treated in a vacuum bag and then heated and pressure treated by an autoclave. The sample was taken out and then its appearance was visually checked under a fluorescent lamp.

In Case 3, similarly to Cases 1 and 2, neither "creases" nor "cracks" were observed in the appearance of the film 70.

(Case 4)

A cycloolefin copolymer (COC) (product name: Gunze F1) was used for the film 70. The thickness of the film 70 is 50 μm.

The elastic modulus of the film 70 is $2.2 \times 10^9$ Pa, and the tensile strength of the film 70 is $7.5 \times 10^7$ Pa.

The value obtained by multiplying the elastic modulus of the film 70 by the thickness of the film 70 is $1.1 \times 10^5$ Pa·m, and the value obtained by multiplying the tensile strength of the film 70 by the thickness of the film 70 is $3.8 \times 10^3$ Pa·m.

Similarly to Case 1, a sample was prepared by using the film 70, and the sample was heat treated in a vacuum bag and then heated and pressure treated by an autoclave. The sample was taken out and then its appearance was visually checked under a fluorescent lamp.

In Case 4, different from Cases 1 to 3, a few "creases" were observed in the appearance of the film 70.

(Case 5)

A cycloolefin copolymer (COC) (product name: Essina) was used for the film 70. The thickness of the film 70 is 50 μm.

The elastic modulus of the film 70 is $2.8 \times 10^9$ Pa, and the tensile strength of the film 70 is $7.9 \times 10^7$ Pa.

The value obtained by multiplying the elastic modulus of the film 70 by the thickness of the film 70 is $1.4 \times 10^5$ Pa·m, and the value obtained by multiplying the tensile strength of the film 70 by the thickness of the film 70 is $3.9 \times 10^3$ Pa·m.

Similarly to Case 1, a sample was prepared by using the film 70, and the sample was heat treated in a vacuum bag and then heated and pressure treated by an autoclave. The sample was taken out and then its appearance was visually checked under a fluorescent lamp.

In Case 4, different from Cases 1 to 3, many "creases" were observed in the appearance of the film 70.

(Case 6)

Epoxy permanent film resist (product name: InterVia 8023) was used for the film 70. The thickness of the film 70 is 1.3 μm.

The elastic modulus of the film 70 is $2.5 \times 10^9$ Pa, and the tensile strength of the film 70 is $9.1 \times 10^7$ Pa.

The value obtained by multiplying the elastic modulus of the film 70 by the thickness of the film 70 is $3.3 \times 10^3$ Pa·m, and the value obtained by multiplying the tensile strength of the film 70 by the thickness of the film 70 is $1.2 \times 10^2$ Pa·m.

Similarly to Case 1, a sample was prepared by using the film 70, and the sample was heat treated in a vacuum bag and then heated and pressure treated by an autoclave. The sample was taken out and then its appearance was visually checked under a fluorescent lamp.

Similarly to Case 1, the sample was heated and pressurized and then its appearance was visually checked under a fluorescent lamp.

In Case 6, different from Cases 1 to 3, "creases" and "cracks" were observed in the appearance of the film 70.

(Case 7)

Epoxy permanent film resist (product name: InterVia 8023) was used for the film 70. The thickness of the film 70 is 8 μm.

The elastic modulus of the film 70 is $2.5 \times 10^9$ Pa, and the tensile strength of the film 70 is $9.1 \times 10^7$ Pa.

The value obtained by multiplying the elastic modulus of the film 70 by the thickness of the film 70 is $2.0 \times 10^4$ Pa·m, and the value obtained by multiplying the tensile strength of the film 70 by the thickness of the film 70 is $7.2 \times 10^2$ Pa·m.

Similarly to Case 1, a sample was prepared by using the film 70, and the sample was heat treated in a vacuum bag and then heated and pressure treated by an autoclave. The sample was taken out and then its appearance was visually checked under a fluorescent lamp.

In Case 7, different from Cases 1 to 3, "creases" and "cracks" were observed in the appearance of the film 70.

(Case 8)

Epoxy permanent film resist (product name: InterVia 8023) was used for the film 70. The thickness of the film 70 is 8 μm.

The elastic modulus of the film 70 is $2.5 \times 10^9$ Pa, and the tensile strength of the film 70 is $9.1 \times 10^7$ Pa.

The value obtained by multiplying the elastic modulus of the film 70 by the thickness of the film 70 is $2.0 \times 10^4$ Pa·m, and the value obtained by multiplying the tensile strength of the film 70 by the thickness of the film 70 is $7.2 \times 10^2$ Pa·m.

Similarly to Case 1, a sample was prepared by using the film 70. In Case 8, different from Case 1, the adhesive layer 71 and the second adhesive layer 72 were formed of a cycloolefin polymer (COP).

The sample was heat treated in a vacuum bag and then heated and pressure treated by an autoclave, and its appearance was visually checked under a fluorescent lamp.

In Case 8, different from Cases 1 to 3, "creases" were observed in the appearance of the film 70.

The examples of Cases 1 to 8 are shown in Table 1.

TABLE 1

| | Elastic Modulus (Pa) | Tensile Strength (Pa) | Thickness (μm) | Elastic Modulus × Thickness (Pa·m) | Tensile Strength × Thickness (Pa·m) | Film Appearance |
|---|---|---|---|---|---|---|
| Case 1 | $2.0 \times 10^9$ | $7.5 \times 10^7$ | 100 | $2.0 \times 10^5$ | $7.5 \times 10^3$ | Good |
| Case 2 | $4.4 \times 10^9$ | $2.8 \times 10^8$ | 50 | $2.2 \times 10^5$ | $1.4 \times 10^4$ | Good |
| Case 3 | $5.3 \times 10^9$ | $2.0 \times 10^8$ | 50 | $2.7 \times 10^5$ | $1.0 \times 10^4$ | Good |
| Case 4 | $2.2 \times 10^9$ | $7.5 \times 10^7$ | 50 | $1.1 \times 10^5$ | $3.8 \times 10^3$ | A few creases |
| Case 5 | $2.8 \times 10^9$ | $7.9 \times 10^7$ | 50 | $1.4 \times 10^5$ | $3.9 \times 10^3$ | Many creases |
| Case 6 | $2.5 \times 10^9$ | $9.1 \times 10^7$ | 1.3 | $3.3 \times 10^3$ | $1.2 \times 10^2$ | Creases and cracks |
| Case 7 | $2.5 \times 10^9$ | $9.1 \times 10^7$ | 8 | $2.0 \times 10^4$ | $7.2 \times 10^2$ | Creases and cracks |
| Case 8 | $2.5 \times 10^9$ | $9.1 \times 10^7$ | 8 | $2.0 \times 10^4$ | $7.2 \times 10^2$ | Creases |

It can be understood from the above examples that in the case where the thickness of the film 70 is 2 μm or more and 400 μm or less (first condition), the value obtained by multiplying the elastic modulus of the film 70 by the thickness of the film 70 is $1.5 \times 10^5$ (Pa·m) or more (second condition), and the value obtained by multiplying the tensile strength of the film 70 by the thickness of the film 70 is $5 \times 10^2$ (Pa·m) or more (third condition), generation of creases and cracks of the film 70 can be suppressed even when the film 70 on which the light-emitting units 20, the IC chips 30, and the wiring unit 40 are provided is heated and curved.

That is, according to Cases 1 to 3, when the first to third conditions described above were satisfied, generation of creases and cracks of the film 70 was not observed.

According to Cases 4 to 8, when the second condition was not satisfied, "creases" were observed in the film 70. It is considered that "creases" are affected by the value obtained by multiplying the elastic modulus of the film 70 by the thickness of the film 70.

According to Cases 6 and 8, it can be understood that when the second condition and the third condition are not satisfied, "cracks" occur as well as "creases." It is considered that "cracks" are affected by the value obtained by multiplying the tensile strength of the film 70 by the thickness of the film 70.

In Cases 7 and 8, the difference is whether the first adhesive layer 71 and the second adhesive layer 72 are formed of polyvinyl butyral (PVB) or a cycloolefin polymer (COP). In the case where COP was used, only "creases" were observed, whereas in the case where PVB was used, "creases" and "cracks" were observed in the film 70.

Third Embodiment

The third embodiment of the present invention will be described with reference to FIGS. 4 and 5A to 5C.

Configuration of Third Embodiment

Figure 4:
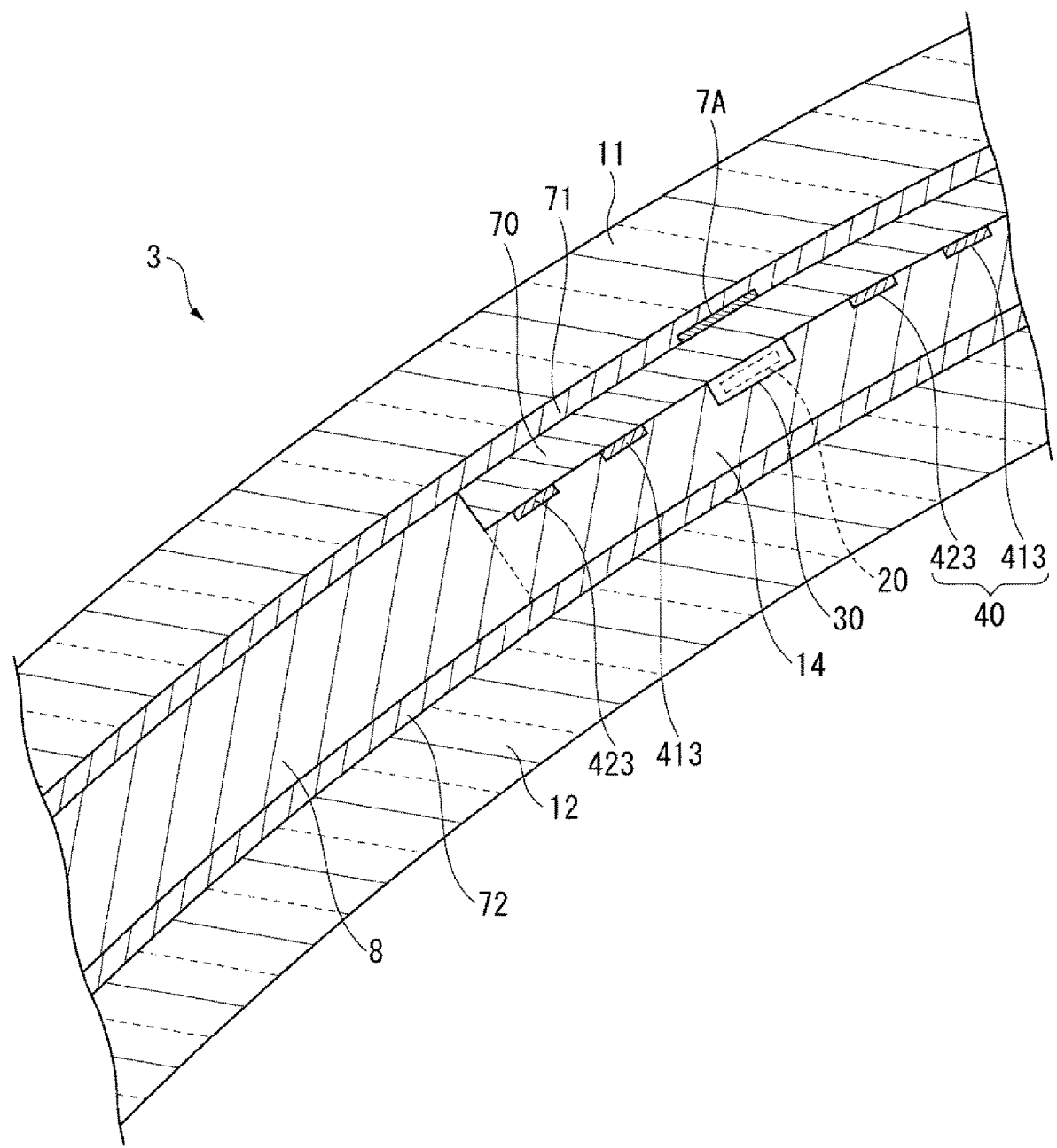
FIG. 4 is a cross-sectional view illustrating a part of the transparent display device according to a third embodiment of the present invention.

As illustrated in FIG. 4, the layer configuration of a transparent display device 3 of the third embodiment is different from that of the second embodiment, but the other configurations thereof are the same as those of the second embodiment.

The transparent display device 3 has a first transparent substrate 11; a first adhesive layer 71; a film 70 having a light shielding layer 7A formed thereon; light-emitting units 20, IC chips 30, a wiring unit 40, and an insulation layer 14 which are provided on the film 70; an intermediate layer 8; a second adhesive layer 72; and a second transparent substrate 12.

The intermediate layer 8 is continuous with the film 70, the light-emitting units 20, the IC chips 30, the wiring unit 40, and the insulation layer 14 along the surface direction of the film 70.

The thickness of the film 70 is 2 μm or more and 400 μm or less, preferably 5 μm or more and 300 μm or less, and more preferably 50 μm or more and 200μ or less.

The thickness of the insulation layer 14 is 0.1 mm or more and 0.9 mm or less, and preferably 0.3 mm or more and 0.8 mm or less.

In a plan view of the transparent display device 3, the film 70, the light-emitting units 20, the IC chips 30, the wiring unit 40, and the insulation layer 14 constitute a display region, and the intermediate layer 8 constitutes a non-display region.

In the third embodiment, the insulation layer 14, the first adhesive layer 71, the second adhesive layer 72, and the intermediate layer 8 are formed of a cycloolefin polymer (COP).

The first transparent substrate 11 and the second transparent substrate 12 are formed of the same glass.

The insulation layer 14 functions as a protective layer that protects the light-emitting units 20, the IC chips 30, and the wiring unit 40.

Here, the insulation layer 14 and the intermediate layer 8 are formed of the same material and, in the form of a product, may be integrated with each other. Alternatively, the insulation layer 14 and the intermediate layer 8 may be formed of similar materials having, for example, different glass transition points (Tg) or additives, or the materials themselves may be different.

In the third embodiment, similar to the second embodiment, the value obtained by multiplying the elastic modulus of the film 70 by the thickness of the film 70 is $1.5 \times 10^5$ (Pa·m) or more, and the value obtained by multiplying the tensile strength of the film 70 by the thickness of the film 70 is $5.0 \times 10^2$ (Pa·m) or more.

The glass transition point (Tg) of the film 70 is, for example, 145° C. The glass transition point (Tg) of the insulation layer 14 is, for example, 125° C.

The first adhesive layer 71, the second adhesive layer 72, and the intermediate layer 8 are formed of the same material. The first adhesive layer 71, the second adhesive layer 72, and the intermediate layer 8 have the same glass transition point (Tg), for example, 90° C.

The glass transition point (Tg) of the film 70 is higher than the glass transition point (Tg) of each of the first adhesive layer 71 and the second adhesive layer 72.

The glass transition point (Tg) of the insulation layer 14 is higher than the glass transition point (Tg) of each of the first adhesive layer 71, the second adhesive layer 72, and the intermediate layer 8. Therefore, in the case where the transparent display device 3 is used for a window glass for vehicles, creases, cracks, and the like hardly occur in the film 70. Here, the glass transition point (Tg) refers to the temperature (° C.) measured by a method conforming to JIS 7172.

Next, a method of manufacturing the transparent display device 3 of the third embodiment will be described with reference to FIGS. 5A to 5C.

Figure 5A:
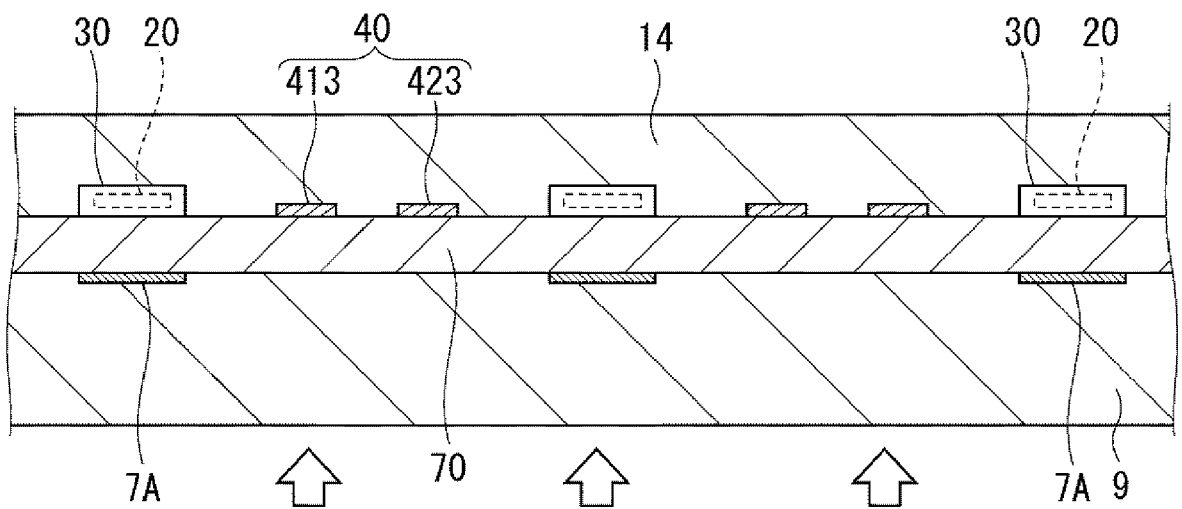
FIG. 5A is a conceptual diagram illustrating a manufacturing process of the transparent display device according to the third embodiment.

As illustrated in FIG. 5A, the film 70 having the light shielding layer 7A formed thereon is placed on a flat plate base 9, the light-emitting units 20, the IC chips 30, and the wiring unit 40 are provided on the film 70, and the insulation layer 14 is provided as a protective layer so as to cover these components. In this embodiment, the light-emitting units 20, the IC chips 30, and the wiring unit 40 may be provided on the film 70 having the light shielding layer 7A formed on its one surface, the insulation layer 14 may be provided as a protective layer so as to cover these components, and this unit may be installed on the base 9. For clarifying the light shielding layer 7A in FIG. 5A, the thickness ratio of the light shielding layer 7A to the base 9 is made larger than the actual one.

Figure 5B:
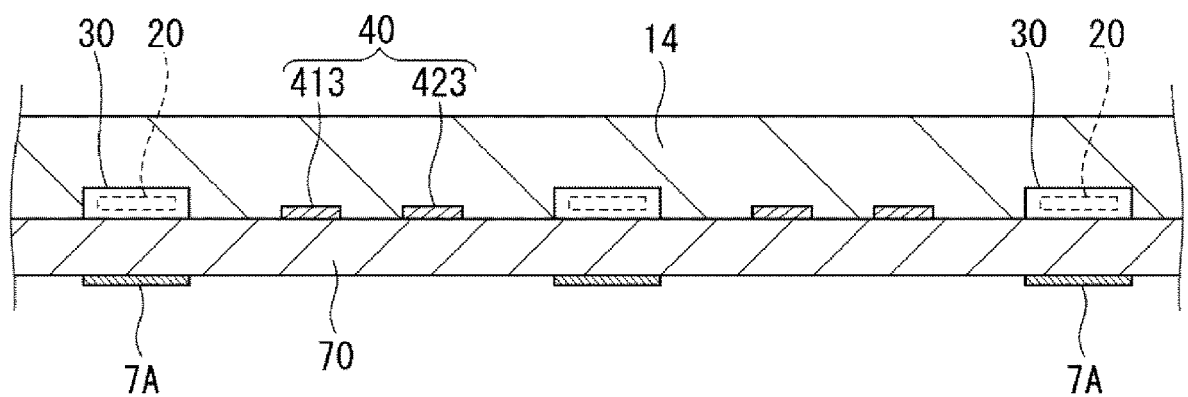
FIG. 5B is a conceptual diagram illustrating a manufacturing process of the transparent display device according to the third embodiment.

FIG. 5B illustrates a state where the base 9 is peeled off from the film 70 on which the light-emitting units 20, the IC chips 30, the wiring unit 40, and the insulation layer 14 are provided.

Figure 5C:
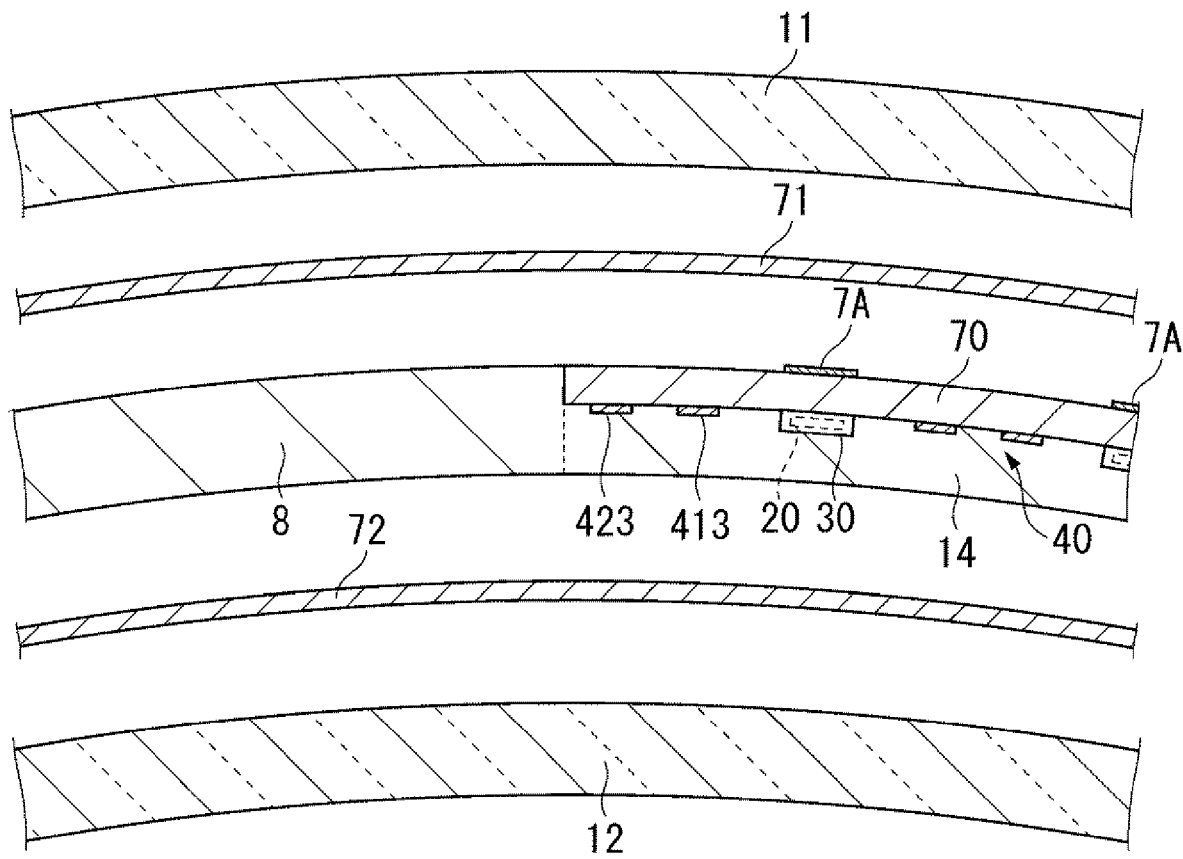
FIG. 5C is a conceptual diagram illustrating a manufacturing process of the transparent display device according to the third embodiment.

As illustrated in FIG. 5C, the second adhesive layer 72 is disposed on the second transparent substrate 12, and the film 70 on which the light-emitting units 20, the IC chips 30, the wiring unit 40, and the insulation layer 14 are provided and the intermediate layer 8 are arranged side by side on the second adhesive layer 72. Then, the first adhesive layer 71 is disposed on these components, and the first transparent substrate 11 is disposed on the first adhesive layer 71. These components are subjected to preliminary pressure-bonding and then subjected to main pressure-bonding with an autoclave.

Effects of Third Embodiment

In the transparent display device 3, the first transparent substrate 11, the first adhesive layer 71, the film 70 on which the light-emitting units 20 and the like are provided and the intermediate layer 8, the second adhesive layer 72, and the second transparent substrate 12 are stacked in a curved state. Since the glass transition point (Tg) of the film 70 is higher than the glass transition point (Tg) of each of the first adhesive layer 71 and the second adhesive layer 72, no stress is generated in the film 70, and creases and cracks hardly occur in the film 70, ensuring good appearance.

Modification of Third Embodiment

In the third embodiment, the first adhesive layer 71, the second adhesive layer 72, and the intermediate layer 8 may be formed of different materials.

Fourth Embodiment

The fourth embodiment of the present invention will be described with reference to FIGS. 6 and 7.

Configuration of Fourth Embodiment

Figure 6:
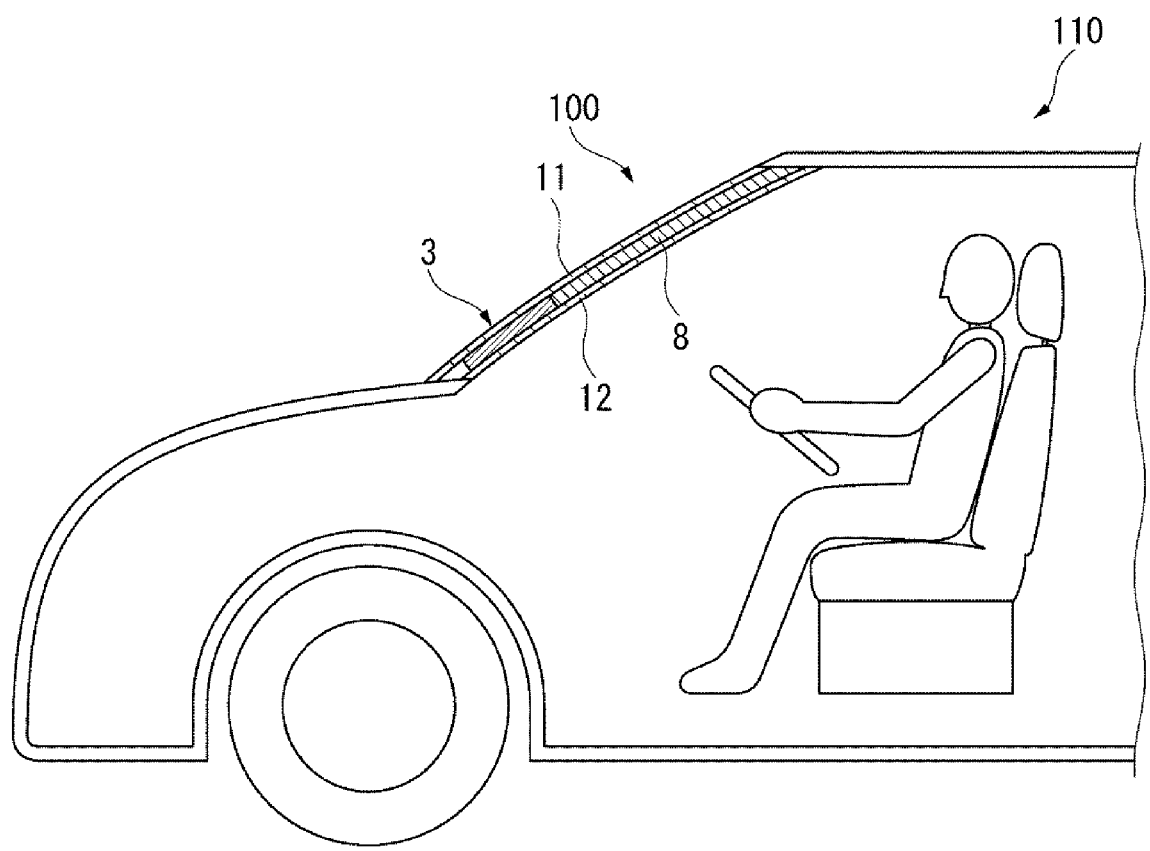
FIG. 6 is a cross-sectional view illustrating a part of an automotive according to a fourth embodiment of the present invention.

As illustrated in FIG. 6, the vehicle of the fourth embodiment is a vehicle 110, and the vehicle 110 has a curved windshield 100.

The windshield 100 has the transparent display device 3 of the third embodiment, and the first transparent substrate 11 and the second transparent substrate 12 in the transparent display device 3 are glass plates constituting the windshield.

Figure 7:
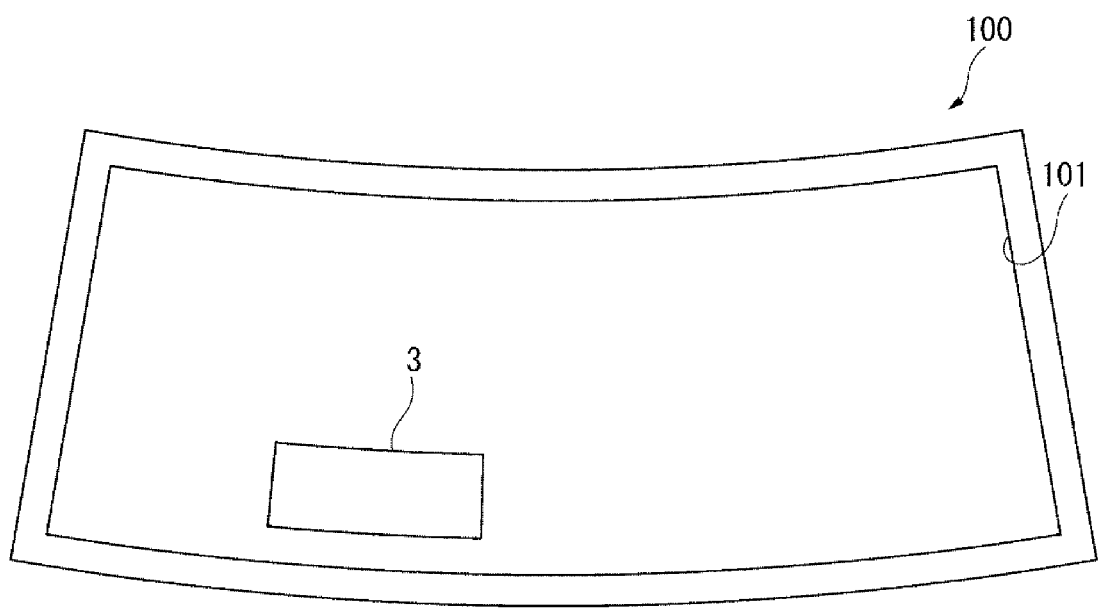
FIG. 7 is a schematic diagram of a windshield in the fourth embodiment and a modification example as viewed from an interior of a vehicle.

As illustrated in FIG. 7, the windshield 100 has a concealment layer 101 provided at the outer periphery of the windshield 100.

The transparent display device 3 is manufactured to be smaller than the windshield 100 and is enclosed within a portion of the lower left side as viewed from the interior of the vehicle. The extent to which the transparent display device 3 is provided may be 50% or less, or even 30% or less of the surface area of the windshield 100.

Effects of Fourth Embodiment

The first transparent substrate 11 and the second transparent substrate 12 are glass plates that are to be assembled to the vehicle 110, which is a vehicle. Therefore, even when the film 70 is heated at the time of manufacturing the windshield 100 and the film 70 is curved, creases and cracks hardly occur in the film 70, ensuring good appearance of the vehicle 110.

Modification of Fourth Embodiment

In the fourth embodiment, the transparent display device 3, not limited to the case of being used for the windshield 100 of the vehicle 110, may be used for a rear window glass or the like of the vehicle 110 or may be used for a window glass of a vehicle such as a railroad vehicle.

In addition, the size of the transparent display device 3 may be approximately the same size as that of the windshield 100.

Other Modification Examples

A configuration may be employed in which the first embodiment and the second embodiment are incorporated into a vehicle.

In the first embodiment, the glass transition point (Tg) of the film 70 may be higher than the glass transition point (Tg) of the adhesive layer 71, and the glass transition point (Tg) of the insulation layer 14 serving as a protective layer may be higher than the glass transition point (Tg) of the adhesive layer 71.

In the other embodiments of the present invention, the first to fourth embodiments and the modification examples may be combined as necessary to the extent possible.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A transparent display device comprising:
a transparent substrate;
a film provided on the transparent substrate via an adhesive layer; and
a plurality of light-emitting units provided on the film, wherein
each of the light-emitting units includes a light-emitting diode having a surface area of 1 mm$^2$ or less,
a thickness of the film is 2 μm or more and 400 μm or less,
a value obtained by multiplying a tensile strength of the film by the thickness is $5\times10^2$ (Pa·m) or more, and
a transmittance of visible light is 20% or more.

2. A transparent display device comprising:
a transparent substrate;
a film provided on the transparent substrate via an adhesive layer; and
a plurality of light-emitting units provided on the film, wherein
each of the light-emitting units includes a light-emitting diode having a surface area of 1 mm$^2$ or less,
a thickness of the film is 2 μm or more and 400 μm or less,
a value obtained by multiplying a tensile strength of the film by the thickness is $5\times10^2$ (Pa·m) or more, and
a transmittance of visible light is 5% or more and a haze is 10 or less.

3. The transparent display device according to claim 1, wherein the elastic modulus of the film is larger than an elastic modulus of the adhesive layer.

4. The transparent display device according to claim 1, further comprising a protective layer covering at least a part of the light-emitting units in a thickness direction,
wherein an elastic modulus of the protective layer is larger than the elastic modulus of the adhesive layer.

5. The transparent display device according to claim 1, further comprising, in a case where the transparent substrate is a first transparent substrate and the adhesive layer is a first adhesive layer, a second transparent substrate provided, via a second adhesive layer, on an opposite side of a surface of the film on which the first adhesive layer is provided.

6. The transparent display device according to claim 3, wherein a value obtained by multiplying an elastic modulus of the film by the thickness is $1.5\times10^5$ (Pa·m) or more.

7. The transparent display device according to claim 5, wherein the first adhesive layer and the second adhesive layer have the same elastic modulus.

8. The transparent display device according to claim 1, wherein a glass transition point (Tg) of the film is higher than a glass transition point (Tg) of the adhesive layer.

9. The transparent display device according to claim 8, further comprising a protective layer covering at least a part of the light-emitting units in a thickness direction,
wherein a glass transition point (Tg) of the protective layer is higher than the glass transition point (Tg) of the adhesive layer.

10. The transparent display device according to claim 9, further comprising, in a case where the transparent substrate is a first transparent substrate and the adhesive layer is a first adhesive layer, a second transparent substrate provided, via a second adhesive layer, on an opposite side of a surface of the film on which the first adhesive layer is provided.

11. The transparent display device according to claim 10, further comprising an intermediate layer continuous with the film and the light-emitting units along a surface direction of the film, wherein
one surface of the intermediate layer is bonded to the first transparent substrate via the first adhesive layer, and another surface of the intermediate layer is bonded to the second transparent substrate via the second adhesive layer, and
a glass transition point (Tg) of the intermediate layer is lower than the glass transition point (Tg) of the protective layer.

12. The transparent display device according to claim 11, wherein the intermediate layer, the first adhesive layer, and the second adhesive layer are formed of the same material.

13. The transparent display device according to claim 10, wherein at least one of the first adhesive layer, the second adhesive layer, and the protective layer contains a cycloolefin polymer.

14. The transparent display device according to claim 1, wherein the transparent substrate is a glass plate that is to be assembled to a vehicle.

15. A vehicle comprising the transparent display device according to claim 1.

* * * * *